United States Patent
Hikichi et al.

[19]
[11] Patent Number: 5,991,889
[45] Date of Patent: Nov. 23, 1999

[54] MICROCOMPUTER CAPABLE OF SUPPRESSING POWER CONSUMPTION EVEN IF A PROGRAM MEMORY IS INCREASED IN CAPACITY

[75] Inventors: Hiroshi Hikichi; Masataka Kimoto, both of Kanagawa, Japan

[73] Assignee: NEC Corporation, Tokyo, Japan

[21] Appl. No.: 09/052,674

[22] Filed: Mar. 31, 1998

[30] Foreign Application Priority Data

Mar. 31, 1997 [JP] Japan ................................. 9-080843

[51] Int. Cl.⁶ .................................................. G06F 1/08
[52] U.S. Cl. .......................................... 713/501; 713/600
[58] Field of Search ................................. 713/500, 501, 713/600, 601, 322

[56] References Cited

U.S. PATENT DOCUMENTS

| | | | |
|---|---|---|---|
| 4,862,348 | 8/1989 | Nakamura | 713/322 |
| 5,426,755 | 6/1995 | Yokouchi et al. | 711/101 |
| 5,483,659 | 1/1996 | Yamamura | 712/43 |
| 5,511,209 | 4/1996 | Mensch, Jr. | 713/500 |

FOREIGN PATENT DOCUMENTS 2-007296  1/1990  Japan ......................... G11C 16/06

*Primary Examiner*—Dennis M. Butler
*Attorney, Agent, or Firm*—Scully, Scott, Murphy & Presser

[57] ABSTRACT

In a microcomputer including a program memory (1) and a CPU (2) operable in one of high-speed and low-speed modes in which the CPU carries out high-speed and low-speed operations when supplied with high-speed and low-speed clock signals (CKH and CKL), respectively, the program memory includes high-speed and low-speed operation memories (11 and 12) for memorizing high-speed and low-speed mode programs which are read by first and second predetermined address ranges of a program address of a program counter (21) of the CPU and which make the CPU carry out the high-speed and the low-speed operations, respectively. A memory controller (3) produces, when detects the second predetermined address range of the program address, a high-speed operation stop signal for stopping operation of the high-speed operation memory. A clock supplying circuit (4) supplies the CPU with one of the high-speed and the low-speed clock signals that corresponds to one of the high-speed and the low-speed modes. The CPU 2 includes an operation mode setting register (22) for setting a different one of the high-speed and the low-speed modes as an operation mode signal (M). In response to the operation mode signal, the clock supplying circuit supplies the CPU 2 with a different one of the high-speed and the low-speed clock signals.

8 Claims, 10 Drawing Sheets

MICROCOMPUTER CAPABLE OF SUPPRESSING POWER CONSUMPTION EVEN IF A PROGRAM MEMORY IS INCREASED IN CAPACITY

BACKGROUND OF THE INVENTION

This invention relates to a microcomputer and, in particular, to a microcomputer of a variable operation speed type for use in a mobile apparatus such as a mobile telephone and a digital video camera.

In recent years, a microcomputer variable in operation speed is used in various kinds of mobile apparatuses such as a mobile telephone and a digital video camera. With an improvement in function of a mobile apparatus of the type, the microcomputer is also required to be improved in function. Presently, an operation frequency is also increased to the order of 10 times that of the prior art. If a high-speed operation is continuously carried out, power consumption is so large that the life of a battery is shortened. This brings about a decrease in commercial value of the mobile apparatus. As well known in the art, power consumption of a logical circuit portion comprising CMOSs (Complementary Metal Oxide Semiconductors) is increased in proportion to the operation frequency. This means that the power consumption can be suppressed by a low-speed operation. Taking this into account, a low-speed operation mode on the order of 32 KHz is introduced in order to decrease the power consumption. Thus, the power consumption is decreased in a standby period.

For example, in the mobile telephone, the high-speed operation such as speech conversion and communication processing is carried out upon speech communication while the low-speed operation such as a clock function and a key input function alone is performed during the standby period. Typically, the stand-by period is substantially longer than a high-speed operation period. Therefore, a continuous usable time duration of the mobile apparatus can be prolonged to thereby increase the commercial value.

On the other hand, the microcomputer uses as a memory readout circuit an analog circuit such as a sense amplifier in which a high-speed operation is realized by flowing the continuous current. With such analog circuit included, the continuous current flows even during the low-speed operation. Therefore, the power consumption can not be decreased during the low-speed operation. Thus, a problem arises in view of the decrease in power consumption.

As an approach to solve the above-mentioned problem, Japanese Unexamined Patent Publication (JP-A) No. 7296/1990 (Reference 1) discloses a memory circuit included in a conventional microcomputer and intended to reduce power consumption of a read only memory (ROM). During the high-speed operation, a high-speed readout operation is carried out by the use of a current-sensing amplifier which is inherently operable at a high speed although a continuous current path is required. During the low-speed operation, low power consumption is achieved by the use of a dynamic readout circuit which has no continuous current path although the operation speed is low.

FIG. 1 shows, in blocks, the memory circuit included in the conventional microcomputer disclosed in Reference 1. The illustrated memory circuit includes ROM cells M3 and M5, each consisting of an N-channel MOS transistor, and a current-sensing amplifier 101. The current-sensing amplifier 101 includes N-channel MOS transistors N12 and N9, P-channel MOS transistors P7 and P8, and an inverter I11 for inverting an electric potential of a node X10 as a common connection point of drains of the transistors N9 and P8 to produce a data signal DI.

The memory circuit further includes N-channel MOS transistors N13, N15, and N16, each forming a switching circuit, P-channel MOS transistors P14, P17, P21, P22, and P28, AND circuits A29 and A30. The AND circuits A29 and A30 have first inputs connected to address lines A1 and A2, respectively, second inputs connected to an output of an OR circuit O27 in common, and outputs connected to gates of the transistors M3 and M5, respectively.

An NOR circuit O23 has a first input connected to a data line D4, a second input supplied with an inverted control signal BCS, and an output connected to a gate of the transistor N12. An NOR circuit O24 has a first input connected to a drain of the transistor N16, a second input supplied with the inverted control signal BCS, and an output connected to a gate of the transistor N16.

An inverter I25 inverts a control signal CS to produce the inverted control signal BCS. An OR circuit O27 calculates a logical sum of a precharge signal ø and the control signal CS. A selection circuit S26 calculates a logical sum of a logical product of a data signal DS on the data line D4 and the inverted control signal BCS and another logical product of the data signal DI and the control signal CS to produce an output signal RO.

The operation will be described with reference to FIG. 1. At first, when the control signal CS has the H level, the transistors P21 and P22 are put in an off state and the OR circuit O27 produces an output of the H level. Therefore, each of the AND circuits A29 and A30 outputs information on each of the address lines A1 and A2 as it is and the transistor P28 is put in an off state. On the other hand, the selection circuit S26 is responsive to the control signal CS of the H level and selectively outputs an output of the inverter I11, i.e., an output of the amplifier 101.

Next, when the control signal CS has the L level, the inverted control signal BCS has the H level. Therefore, the NOR circuits O23 and O24 produce outputs of the L level and the transistors N12 and N16 are turned into an off state to interrupt the continuous current path passing through the transistors N12 and N13 and the transistor P17. On the other hand, the transistors P21 and P22 are turned into an on state so that the H level is supplied to gates of the transistors P8 and P14 so that the transistors P8 and P14 are turned off. As a result, the continuous current passing through the transistors P14 and N13 and the transistors P8 and N9 is interrupted also. On the other hand, the selection circuit S26 is responsive to the control signal CS of the L level and selectively outputs the data DS as an output of a dynamic readout circuit 102. If the precharge signal ø has the L level, each of the AND circuits A29 and A30 produces an output of the L level. Therefore, the ROM cells M3 and M5 are put in an off state. In this period, the selection circuit S26 outputs the data on the data line D4 precharged, i.e., the H level. Subsequently, if the precharge signal ø is turned into the H level, the transistor P28 is turned off. If the address line A1 has the H level, the AND circuit A29 produces an output of the H level. However, since the drain of the ROM cell M3 is not connected to the data line D4, the data line D4 holds the precharged H level as memorized data and outputs the memorized data.

As described above, in the memory unit included in the conventional microcomputer, the control signal CS is set at the H level when the high-speed operation such as the operation at 20 MHz is required. Thus, a high-speed readout circuit using the current-sensing amplifier 101 is operated as a memory readout circuit to read from the memory at a high speed a program to be executed.

If a low-power-consumption operation is required in a low-speed operation such as on the order of 32 KHz, the control signal CS is set at the L level to switch the readout circuit into the dynamic readout circuit 102 which reads from the memory the program to be executed. The dynamic readout circuit 102 is substantially equivalent to a part which is formed by removing the current-sensing amplifier 101 from the memory circuit illustrated in FIG. 1. Considering the power consumption of the memory, power supply to the amplifier 101 consuming large electric power is stopped in response to the control signal CS. Accordingly, the dynamic readout circuit 102 requires current consumption corresponding to charge/discharge current of the bit lines alone. Thus, a low-power-consumption operation can be realized in the low-speed operation.

With the improvement in function of the microcomputer following the recent improvement in function of the mobile apparatus, the operation frequency is presently increased to the order of 10 times that of the prior art. If the high-speed operation is continuously carried out, the life of the battery is shortened due to large power consumption. This brings about the decrease in commercial value of the mobile apparatus. Taking the above into account, the low-speed operation mode on the order of 32 KHz is introduced as described in the foregoing in order to reduce the power consumption. Thus, the power consumption is reduced during the stand-by period.

In addition, development of programs in the C language as a high-grade language and increase in function of the mobile apparatus lead to the recent increase in program size. In order to cope with this, the memory (ROM) contained in the microcomputer is increased in size to the order of 10 times that of the prior art. Under the circumstances, even if the readout circuit for the program storage memory is implemented by the current-sensing amplifier and the dynamic readout circuit used in the high-speed operation and the low-speed operation, respectively, the power consumption during the low-speed operation is greater than that of the prior art because of the large memory size.

The reason why the power consumption is increased even in the low-speed operation will be described in the following.

Taking the charge and the discharge into consideration, the current consumption IB per bit line is given by:

$$IB = f(\text{operation frequency KHz}) \cdot C (\text{load capacity PF}) \cdot V \times 2$$

In case of an actual high-end microcomputer, an instruction code is read by every 32 bits (4 bytes) equal to a word length. It is therefore presumed that the number of data lines to be charged and discharged is equal to 16 on average.

In case of an ROM having a small memory size of several tens Kbytes, the load capacity per data line is about 5 pF. Assuming that the operation frequency during the low-power-consumption operation is equal to 32 KHz and that the operation voltage is equal to 3 V, the current consumption IBS is given by:

$$IBS = 32 \times 5 \times 3 \times 16 (\text{number of data lines}) \times 2 = \text{about } 15 \ \mu A$$

However, the size of the ROM is increased in recent years as described above. For example, in case of a typical latest ROM having a size of several hundreds Kbytes, a load capacity per data line is about 20 pF. In this event, the current consumption IBL is given by:

$$IBL = 32 \times 20 \times 3 \times 16 \times 2 = \text{about } 61 \ \mu A$$

Even if the reading means similar to the memory of the conventional microcomputer is adopted, the current consumption is at least equal to about 61 $\mu A$ which corresponds to the power consumption of four times that of the prior art.

The conventional microcomputer described above has a structure such that an entire area of the program storage memory can be accessed even during the low-speed operation corresponding to the low power consumption. Therefore, with the increase in capacity of the program storage memory as a result of the increase in function, the current consumption corresponding to the charge/discharge current in memory access is increased to become unignorable.

SUMMARY OF THE INVENTION

It is an object of this invention to provide a microcomputer capable of suppressing an increase in current consumption even if a program storage memory is increased in capacity following an improvement in function.

Other objects of this invention will become clear as the description proceeds.

A microcomputer to which this invention is applicable comprises a program memory for memorizing a program, a central processing unit operable in one of high-speed and low-speed modes in which the central processing unit carries out high-speed and low-speed operations when supplied with high-speed and low-speed clock signals, respectively, and an operation clock supplying circuit for supplying the central processing unit with one of the high-speed and the low-speed clock signals that corresponds to the one of the high-speed and the low-speed modes when the central processing unit operates in the one of the high-speed and the low-speed modes. The central processing unit comprises a program counter for producing a program address for use in reading the program from the memory circuit and an operation mode setting register for setting a different one of the high-speed and the low-speed modes to produce an operation mode signal representing the different one of the high-speed and the low-speed modes. The operation clock supplying circuit is connected to the operation mode setting register to supply the central processing unit with a different one of the high-speed and the low-speed clock signals when the operation mode signal represents the different one of the high-speed and the low-speed modes.

According to this invention, the program memory comprises a high-speed operation memory for memorizing a high-speed mode program which is read by a first predetermined address range of the program address and which is delivered to the central processing unit to make the central processing unit carry out the high-speed operation and a low-speed operation memory for memorizing a low-speed mode program which is read by a second predetermined address range of the program address and which is delivered to the central processing unit to make the central processing unit carry out the low-speed operation. The microcomputer further comprises memory operation control means for producing a high-speed operation stop signal for stopping operation of the high-speed operation memory when the central processing unit carries out the low-speed operation.

DESCRIPTION OF THE PREFERRED EMBODIMENTS

Figure 2:
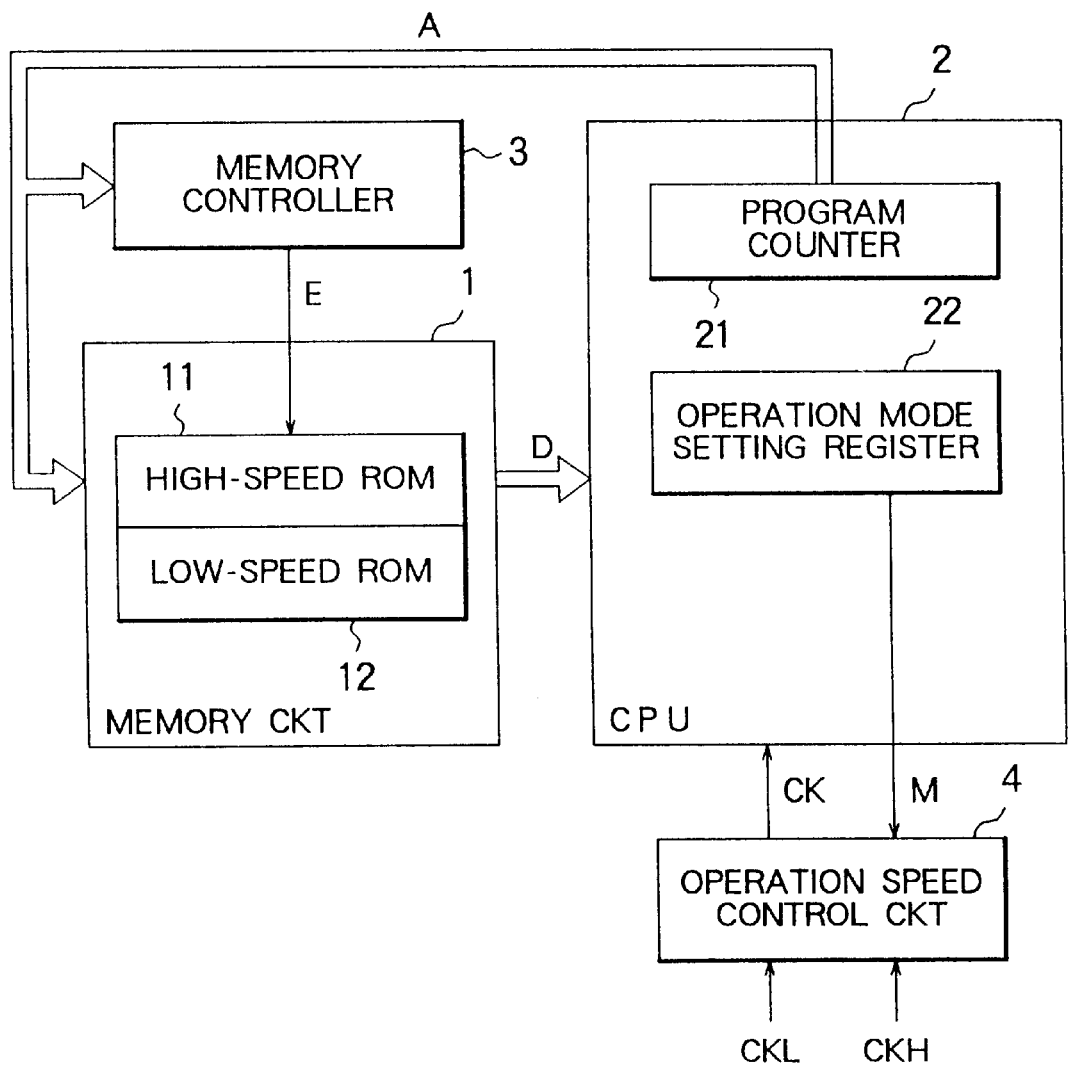
FIG. 2 is a block diagram of a microcomputer according to a first embodiment of this invention.

Referring to FIG. 2, a microcomputer according to a first embodiment of this invention comprises a memory circuit 1 for storage of a program, a CPU 2, a memory controller 3 for producing an operation request signal E, and an operation speed control circuit 4 responsive to supply of an operation mode setting signal M for selecting either one of external clocks CKL (32 KHz) and CKH (20 MHz) as an operation clock CK to be supplied to the CPU 2.

Figure 1:
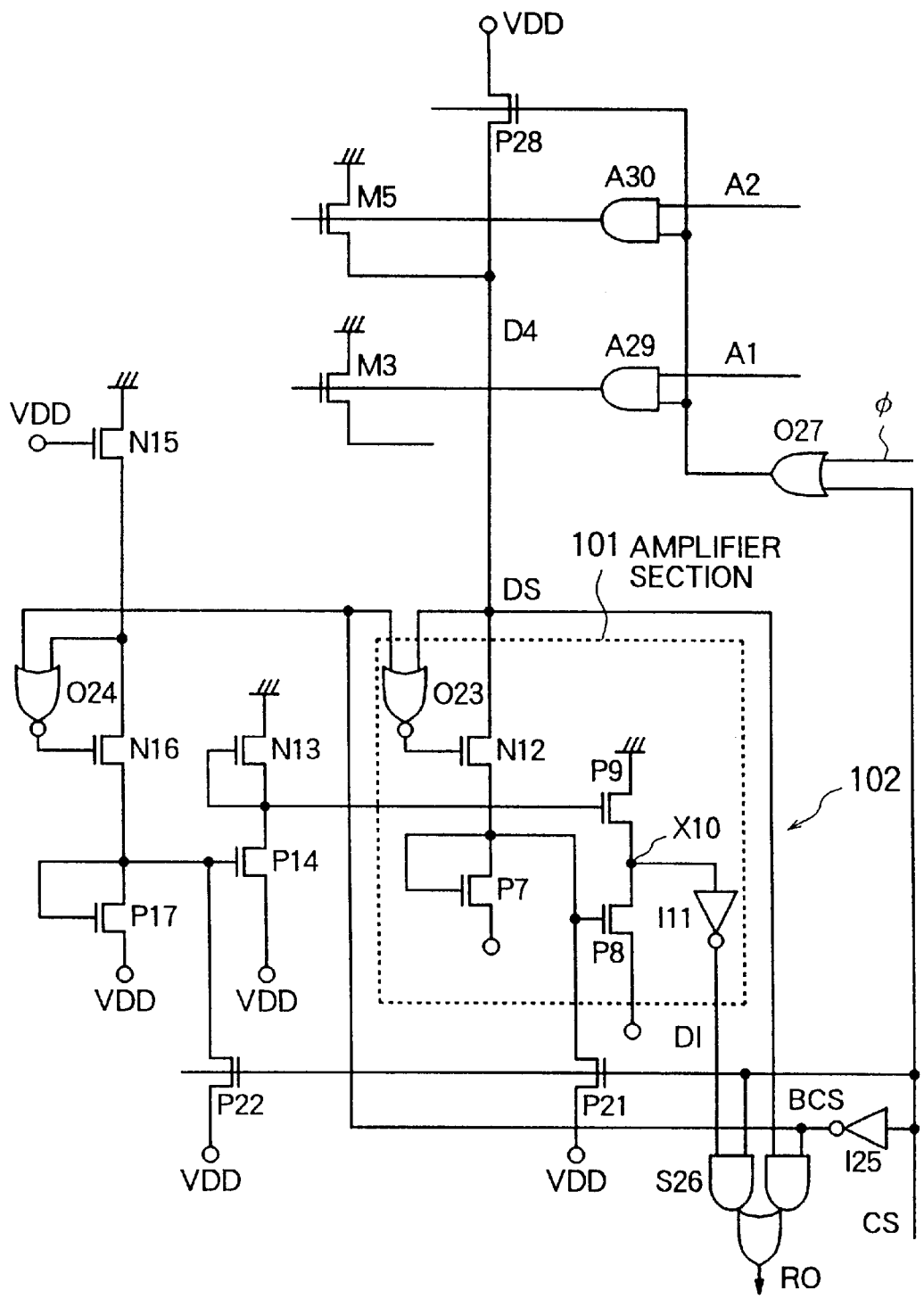
FIG. 1 is a circuit diagram of a memory circuit of a conventional microcomputer.

The memory circuit 1 comprises a high-speed ROM 11 (latter illustrated in FIG. 5) for carrying out a high-speed operation using the current-sensing amplifier 101 of FIG. 1 as a readout circuit and a low-speed ROM 12 for carrying out a low-speed low-power-consumption operation using the dynamic readout circuit 102 which is substantially equivalent to a part formed by removing the current-sensing amplifier 101 from the memory circuit of FIG. 1.

The CPU 2 comprises a program counter 21 and an operation mode setting register 22 for setting either one of high-speed and low-speed modes to produce the operation mode setting signal M.

Figure 3:
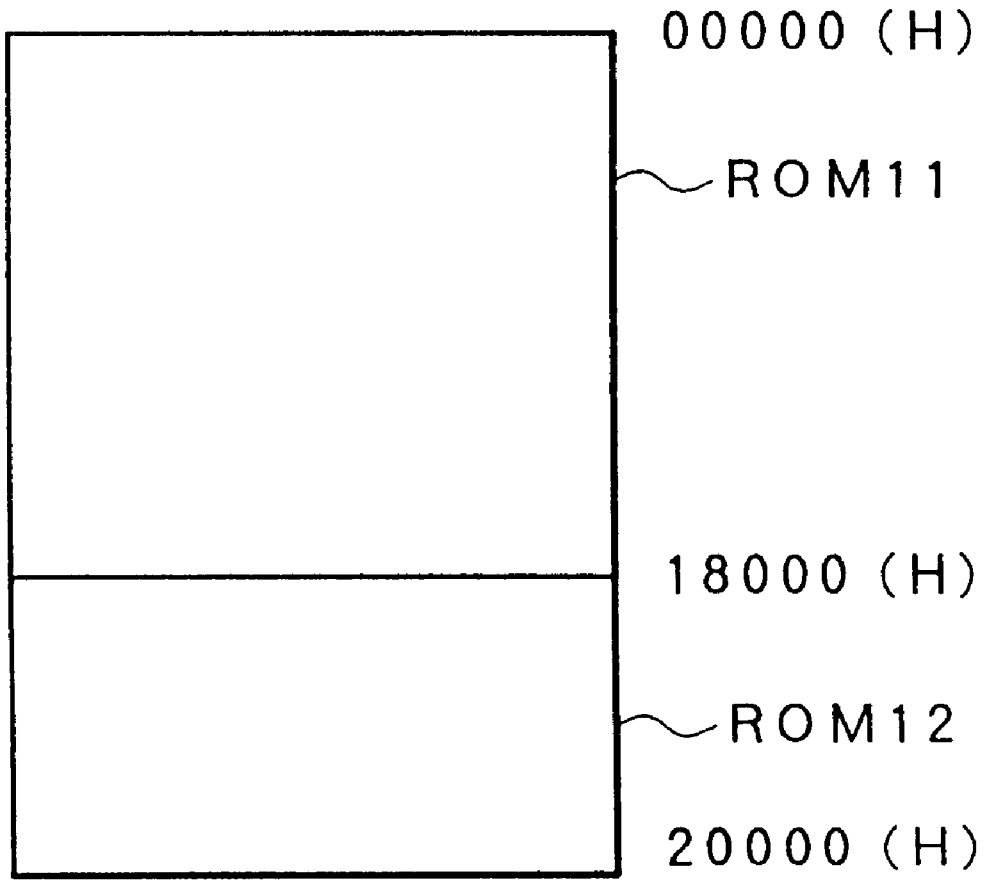
FIG. 3 is a memory map diagram of high-speed and low-speed ROMs of the microcomputer illustrated in FIG. 2.

Referring to FIG. 3 schematically showing one example of a memory map of the memory circuit 1, the memory circuit 1 has a total memory capacity of 128 Kbytes. Addresses 10000 (H) to 18000 (H) correspond to the high-speed ROM 11 while addresses 18000 (H) to 20000 (H) correspond to the low-speed ROM 12, where (H) represents a hexadecimal number system.

The operation of this embodiment will now be described with reference to FIGS. 2 and 3. At first, the program counter 21 in the CPU 2 delivers an instruction read address A to the high-speed ROM 11 and the low-speed ROM 12 of the memory circuit 1. With reference to the value of the above-mentioned address A, the high-speed ROM 11 and the low-speed ROM 12 supply the CPU 2 with a program code as instruction data D. The memory controller 3 monitors the value of the above-mentioned address A and judges the high-speed operation or the low-power-consumption operation with reference to the value of the address A. When the memory controller 3 judges the high-speed operation, the memory controller 3 delivers the operation request signal E of an H level (namely, a high level) to the high-speed ROM 11. When the memory controller 3 judges the low-power-consumption operation, the memory controller 3 delivers the operation request signal E of an L level (namely, a low level) to the high-speed ROM 11. With reference to the value of the operation mode setting signal M produced by the operation mode setting register 22 in the CPU 2, the operation speed setting circuit 4 switches the external clock CKL of 32 KHz into the external clock CKH of 20 MHz and vice versa and supplies either one as the operation clock CK to the CPU 2.

Figure 4:
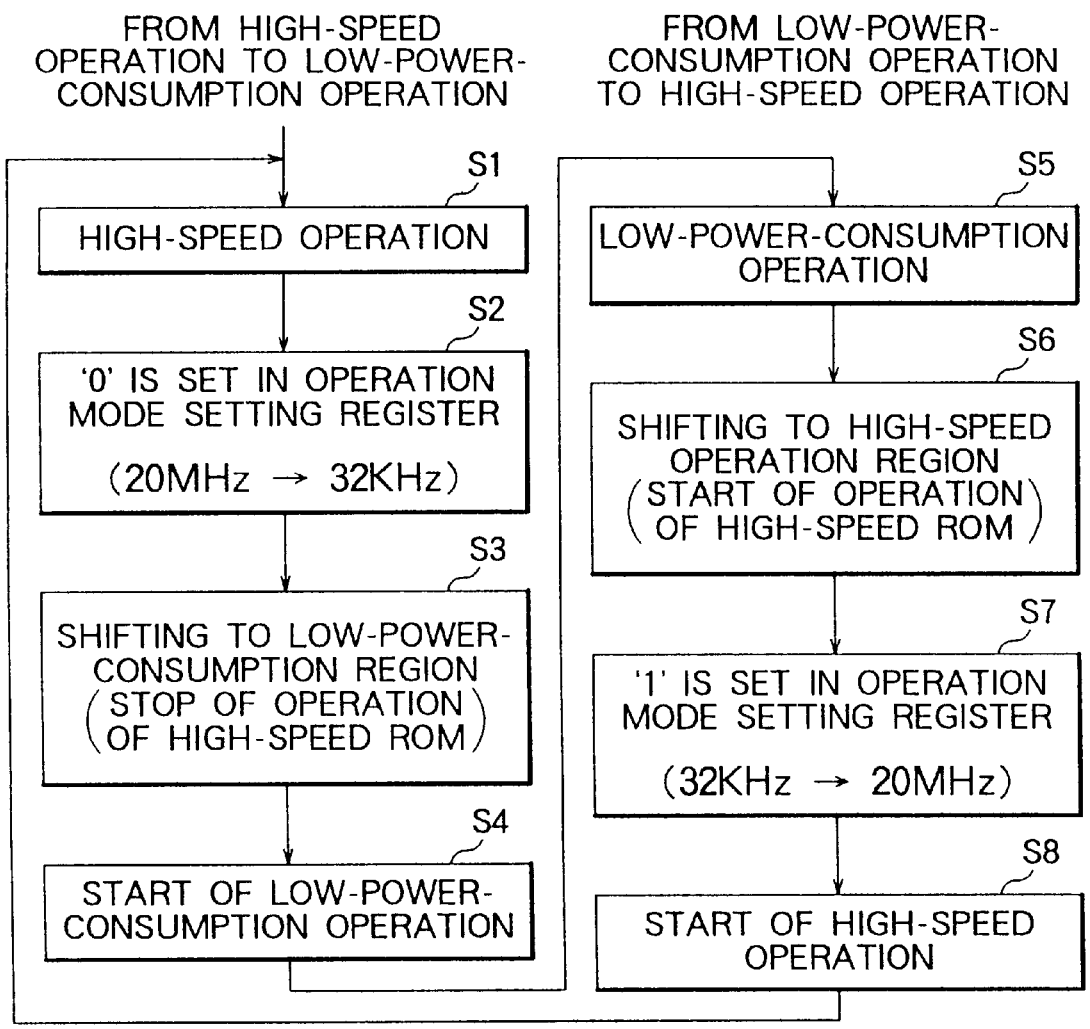
FIG. 4 is a flow chart showing an example of operation of the microcomputer illustrated in FIG. 2.

Additionally referring to FIG. 4 showing a flow chart of the operation of this embodiment, the high-speed ROM 11 is used in the high-speed operation (step S1). The program is read from the addresses 00000 (H) to 18000 (H) and predetermined processing is executed. Next, if the operation is changed from the high-speed operation into the low-power-consumption operation, zero is written in the operation mode setting register 22 to make the operation mode setting signal M have the L level so that the operation frequency, i.e., the frequency of the clock CK is changed from 20 MHz into 32 KHz (step S2). Then, shifting to the ROM addresses 18000 (H) to 20000 (H) is carried out which corresponds to the low-speed ROM 12 (step S3). In this event, the memory controller 3, which is monitoring the value of the address A, judges the occurrence of transition to the low-power-consumption mode and supplies the high-speed ROM 11 with the operation request signal E of the L level. Consequently, the current supply to the high-speed ROM 11 is stopped.

Next, during the low-power-consumption operation, the program stored in the ROM at the addresses 18000 (H) and thereafter is read to execute the operation (steps S4, S5). If the operation is changed from the low-power-consumption operation to the high-speed operation, shifting to the ROM addresses 00000 (H) to 18000 (H) is carried out which corresponds to the high-speed ROM 11 (step S6). After the shifting, the memory controller 3 judges the high-speed operation mode and supplies the high-speed operation high-speed ROM 11 with the operation request signal E having the H level. Thus, the current supply to the high-speed ROM 11 is restarted. After the divergence, one is written in the operation mode setting register 22 to change the operation frequency, i.e., the frequency of the clock CK from 32 KHz into 20 MHz. Then, the high-speed operation is started (step S8).

Figure 5:
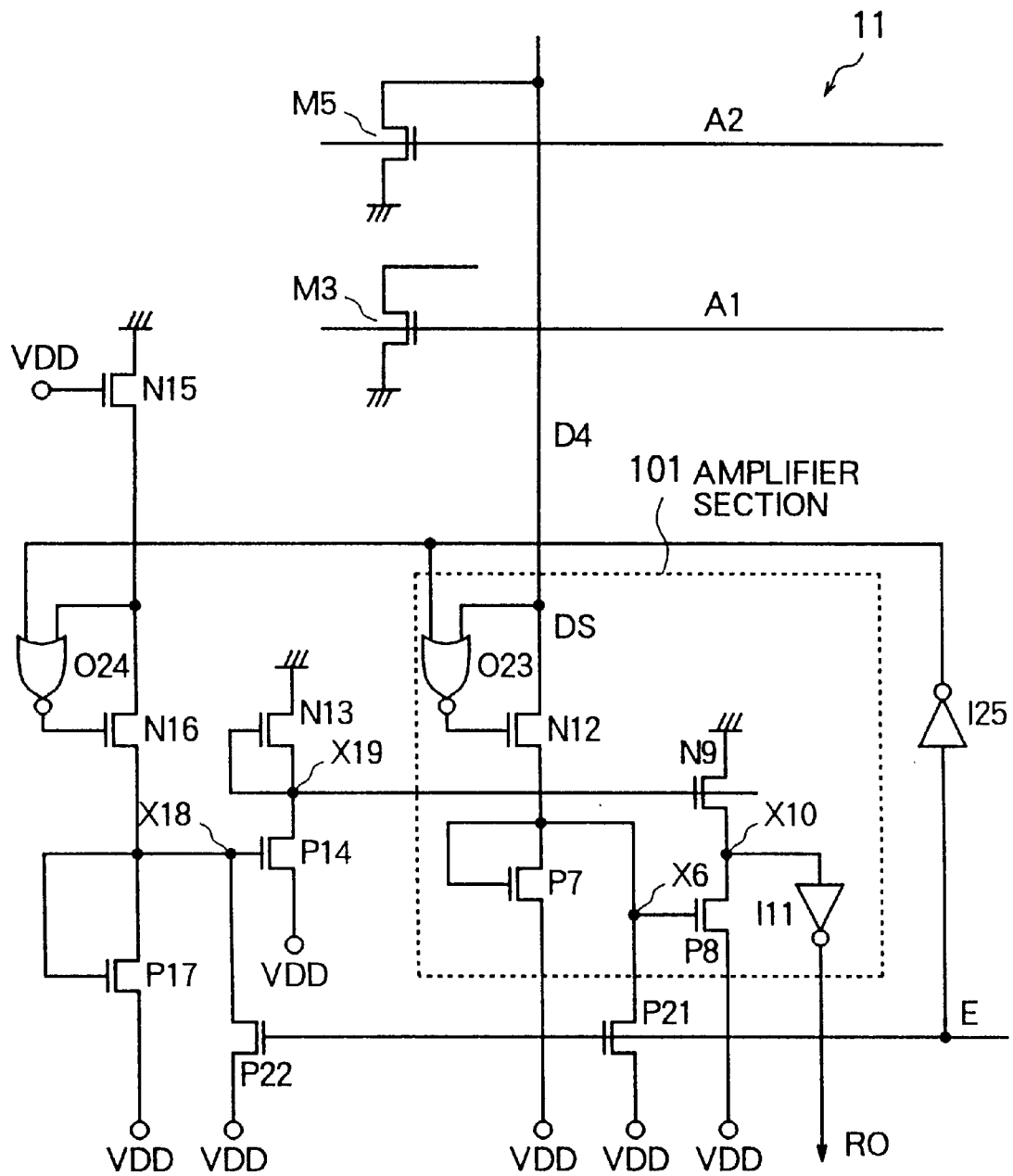
FIG. 5 is a circuit diagram showing an example of a readout circuit of the microcomputer illustrated in FIG. 2.

Next referring to FIG. 5 showing a circuit diagram of the high-speed ROM 11 of the memory circuit 1 with similar characters/numerals affixed to components common to those illustrated in FIG. 1, the high-speed ROM 11 includes, as components common to the prior art, the ROM cells M3 and M5, the current-sensing amplifier 101, the transistors N13, N15, N16, P14, P17, P21, and P22, the NOR circuit O24, and the inverter I25. Since no dynamic readout circuit is necessary, the selection circuit S26 (FIG. 1) is omitted. Since no precharge signal is required, the OR circuit O27 (FIG. 1), the AND circuits A29 and A30 (FIG. 1), and the transistor P28 (FIG. 1) are omitted.

In FIG. 5, the operation will be described. If the high-speed ROM 11 is used, the operation request signal E of the H level is supplied to the high-speed ROM 11. In this event, the NOR circuits O23 and O24 connected via the inverter I25 act as inverters to operate the sense amplifier 101. Therefore, the states of the ROM cells M3 and M5 can be read.

Next, if the high-speed ROM 11 is stopped to suppress current consumption, the operation request signal E of the L level is supplied to the high-speed ROM 11. In response to the operation request signal E of the L level, the transistors P21 and P22 are turned into an on state. Accordingly, nodes X6 and X18 are given the H level so that the transistors P7, P8, P14, and P17 stop the current supply to the nodes X10 and X19. On the other hand, the inverter I25 produces an output of the H level so that the NOR circuits 023 and 024 stops the operation as the inverters. As a result, the current supply to the current-sensing amplifier 101 is stopped so that current consumption of the sense amplifier 101 of the high-speed ROM 11 becomes equal to zero.

Summarizing in FIG. 2, a microcomputer includes a program memory for memorizing a program, a central processing unit (2) operable in one of high-speed and low-speed modes in which the central processing unit carries out high-speed and low-speed operations when supplied with high-speed and low-speed clock signals (CKH and CKL), respectively, and an operation clock supplying circuit (4) for supplying the central processing unit with one of the high-speed and the low-speed clock signals that corresponds to the one of the high-speed and the low-speed modes when the central processing unit operates in the one of the high-speed and the low-speed modes.

The central processing unit includes a program counter (21) for producing a program address for use in reading the program from the program memory and an operation mode setting register (22) for setting a different one of the high-speed and the low-speed modes to produce an operation mode signal (M) representing the different one of the high-speed and the low-speed modes. The operation clock supplying circuit is connected to the operation mode setting register to supply the central processing unit with a different one of the high-speed and the low-speed clock signals when the operation mode signal represents the different one of the high-speed and the low-speed modes.

The program memory includes a high-speed operation memory (11) for memorizing a high-speed mode program which is read by a first predetermined address range (00000 (H)–18000 (H) in FIG. 3) of the program address and which is delivered to the central processing unit to make the central processing unit carry out the high-speed operation and a low-speed operation memory (12) for memorizing a low-speed mode program which is read by a second predetermined address range (18000 (H)–20000 (H) in FIG. 3) of the program address and which is delivered to the central processing unit to make the central processing unit carry out the low-speed operation.

The microcomputer further includes a memory controller (3) which is connected to the program counter for producing, when the memory controller detects the second predetermined address range of the program address, a high-speed operation stop signal for stopping operation of the high-speed operation memory. The memory controller further produces, when the memory controller detects the first predetermined address range of the program address, a low-speed operation stop signal for stopping operation of the low-speed operation memory.

In FIG. 5, the high-speed operation memory is a high-speed operation ROM (read-only memory) (11) including ROM cells (M3, M5) for memorizing the high-speed mode program and a current-sensing amplifier readout circuit (101) used as a readout circuit in reading the high-speed mode program from the ROM cells.

In FIG. 2, the low-speed operation memory is a low power consumption ROM (12) including different ROM cells (M3, M5 in FIG. 1) for memorizing the low-speed mode program and a low power consumption readout circuit (102 in FIG. 1) of a bit-line charge/discharge type which is lower in power consumption than the high-speed operation ROM. The low power consumption readout circuit is used as another readout circuit in reading the low-speed mode program from the different ROM cells.

Figure 6:
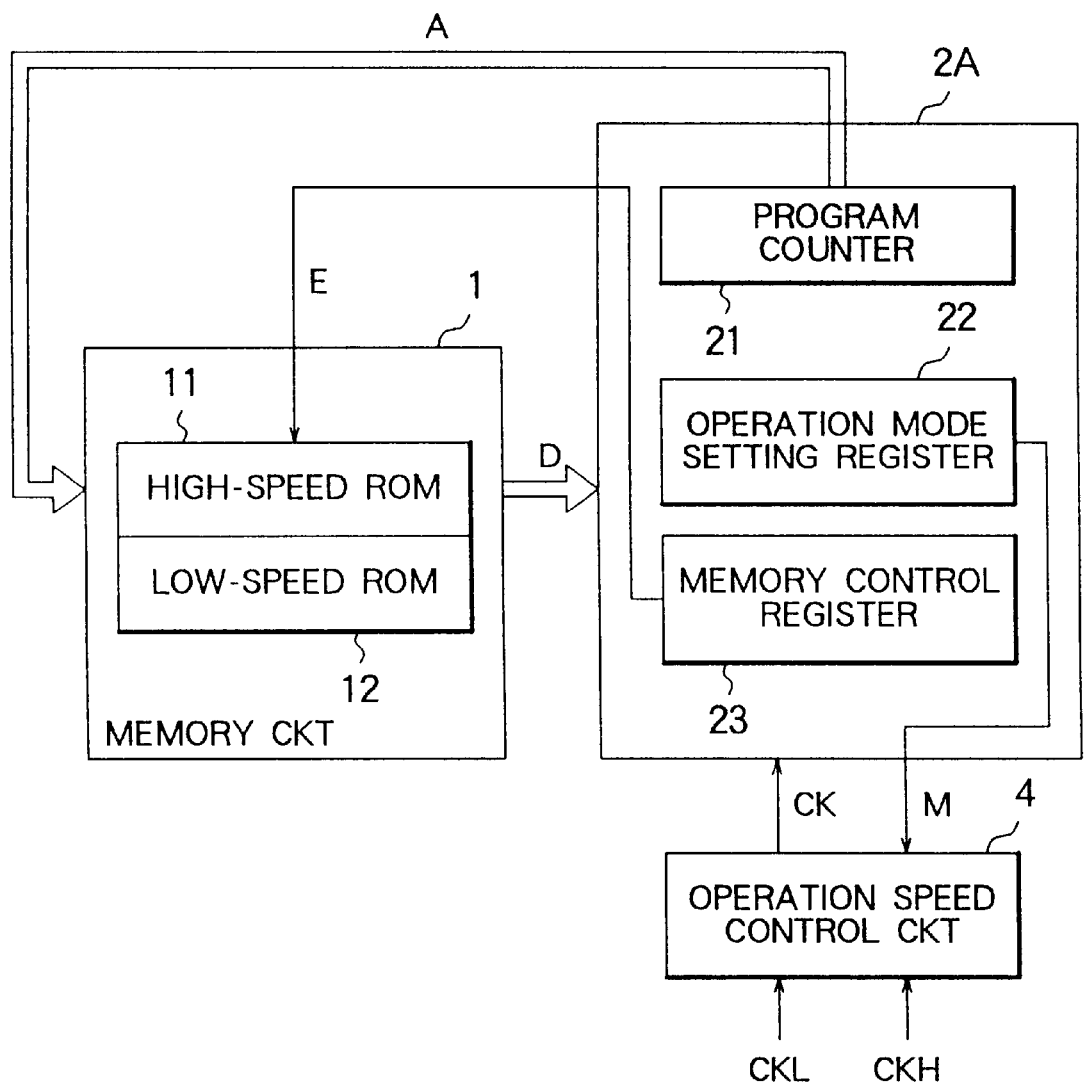
FIG. 6 is a block diagram of a microcomputer according to a second embodiment of this invention.

Next referring to FIG. 6 showing, in blocks, a second embodiment of this invention with similar characters/ numerals affixed to components common to those illustrated in FIG. 2, a difference between this embodiment illustrated in FIG. 6 and the first embodiment of FIG. 2 resides in that the CPU 2 is replaced by a CPU 2A further comprising a memory control register 23 for producing the operation request signal E corresponding to either H or L level written by a program instruction and that the memory controller 3 (FIG. 2) is deleted. The memory control register 23 comprises a flip-flop or the like.

Figure 7:
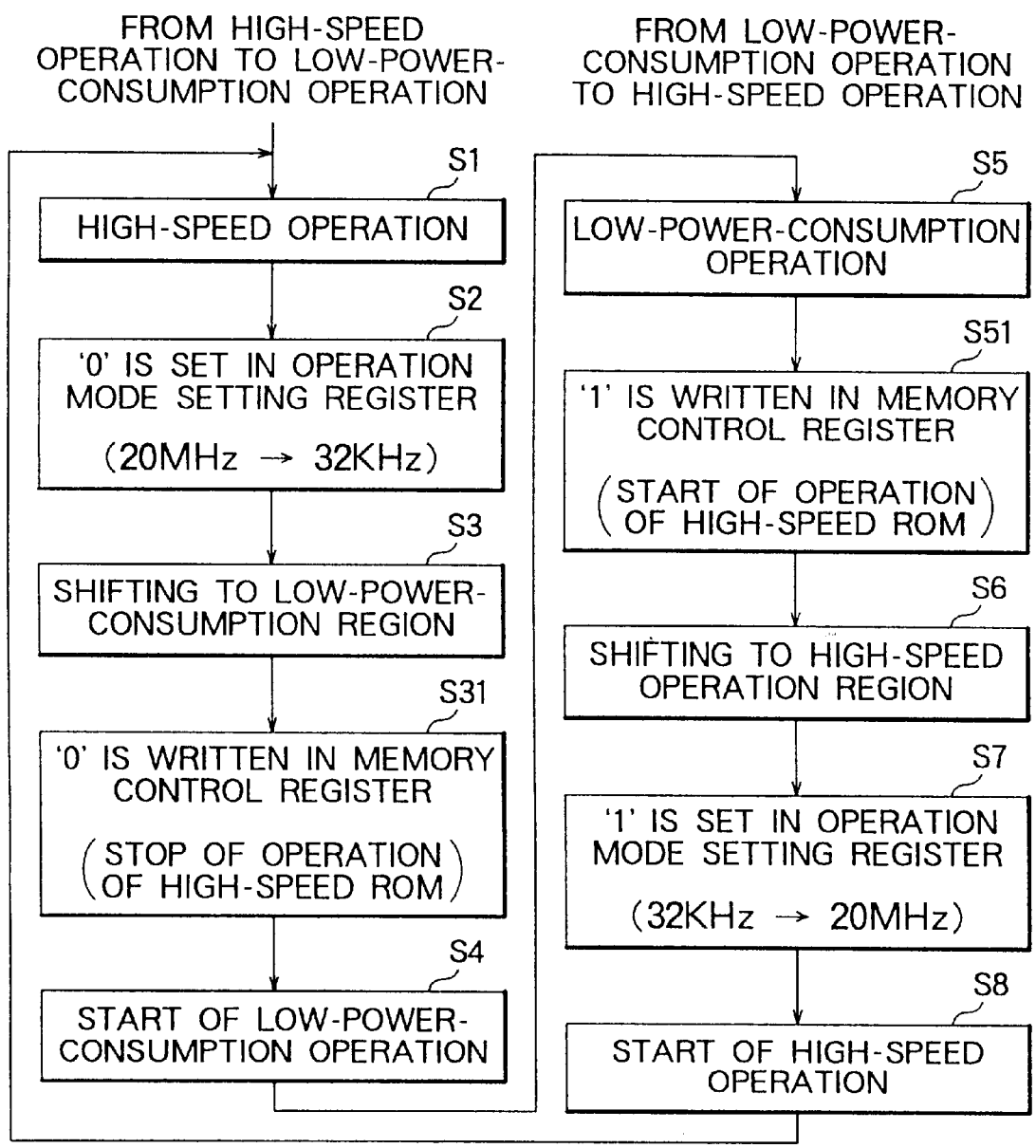
FIG. 7 is a flow chart showing an example of operation of the microcomputer illustrated in FIG. 6.

Referring to FIG. 6 together with FIG. 7 showing a flow chart of processing of this embodiment, description will be made about the operation of this embodiment. Herein, the operation and the stop of the high-speed ROM 11 is not controlled via address monitoring by the memory controller 3. Instead, the operation and the stop is controlled by executing the program and writing either H or L into the memory control register 23 in response to the instruction from the CPU 2A. In this embodiment, the current supply to the high-speed ROM 11 is controlled with reference to the content of the memory control register 23. This enables the control independent of the ROM address of the high-speed ROM 11.

At first, if the operation is changed from the high-speed operation (step S1) to the low-power-consumption operation, zero is written into the operation mode setting register 2 to change the operation frequency from 20 MHz into 32 KHz (step S2). Then, shifting to the low-speed ROM 12 is carried out (step S3). Thereafter, zero is written into the memory control register 23 (step S31). Thus, the operation request signal E of the L level is delivered to the high-speed ROM 11 so that the current supply to the high-speed ROM 11 is stopped and the low-power-consumption operation is started (steps S4 and S5).

Subsequently, when the operation is changed from the low-power-consumption operation to the high-speed operation, one is written into the memory control register 23 (step S51). The operation request signal is given the H level and the current supply to the high-speed ROM 11 is restarted so that the high-speed ROM 11 starts its operation again. After shifting to the high-speed ROM 11 is carried out (step S6), one is written into the operation mode setting register 22 to change the operation frequency from 32 KHz into 20 MHz (step S7). Then, the high-speed operation is started (step S8).

Summarizing in FIG. 6. the memory control register (23) is operable as a memory control unit which is included in the central processing unit (2A) for producing a high-speed operation stop signal for stopping operation of the high-speed operation memory when the central processing unit carries out the low-speed operation.

The memory control unit further produces a low-speed operation stop signal for stopping operation of the low-speed operation memory when the central processing unit carries out the high-speed operation.

Figure 8:
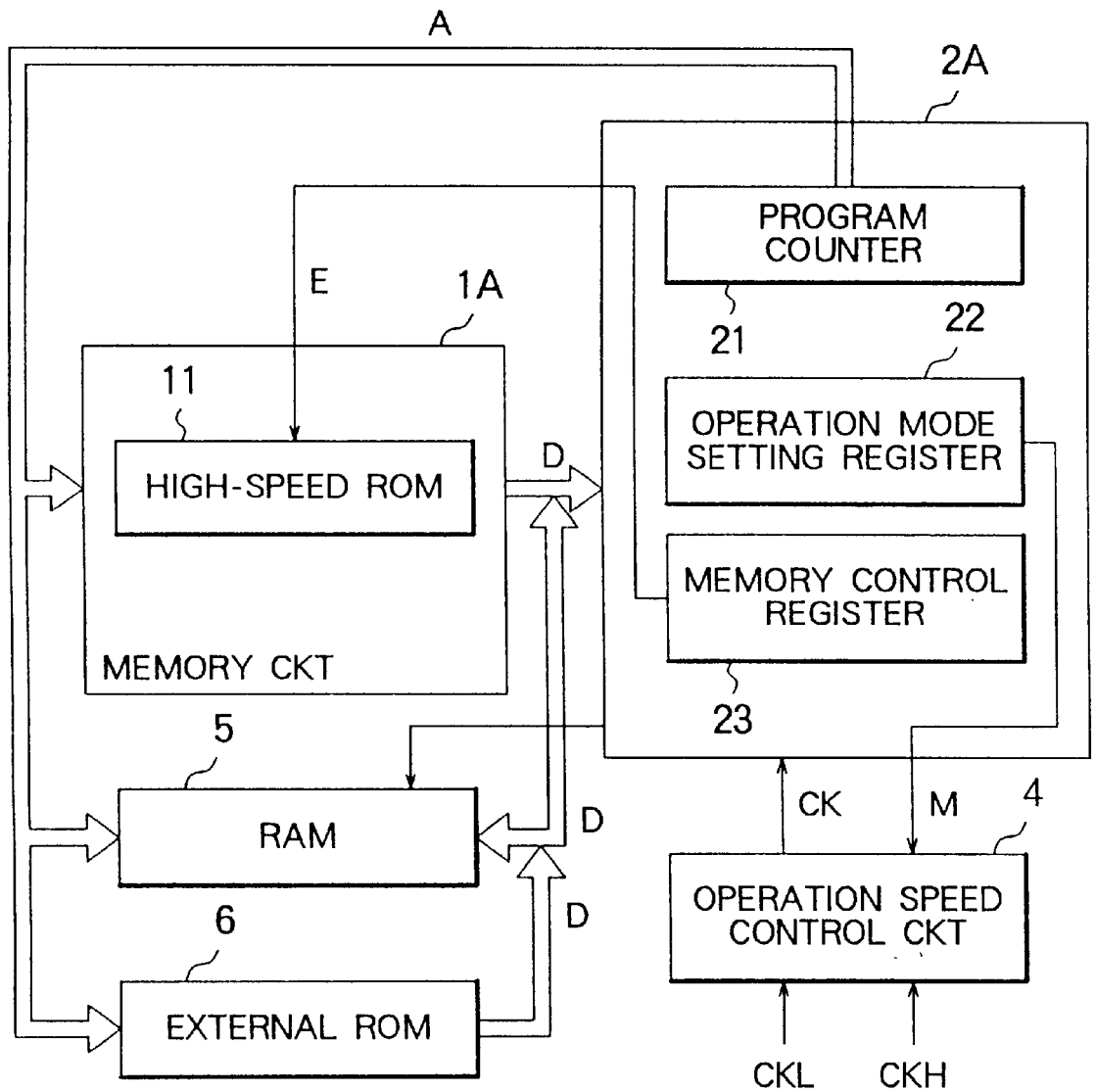
FIG. 8 is a block diagram of a microcomputer according to a third embodiment of this invention.

Next referring to FIG. 8 showing, in blocks, a third embodiment of this invention with similar characters/ numerals affixed to components common to those illustrated in FIG. 6, a difference between this embodiment of FIG. 8 and the second embodiment of FIG. 6 resides in that the low-speed ROM 12 of FIG. 6 is replaced by a low-power-consumption random access memory (RAM) 5 capable of reading data such as by a dynamic operation and an external ROM 6 for storing a desired program.

Figure 9:
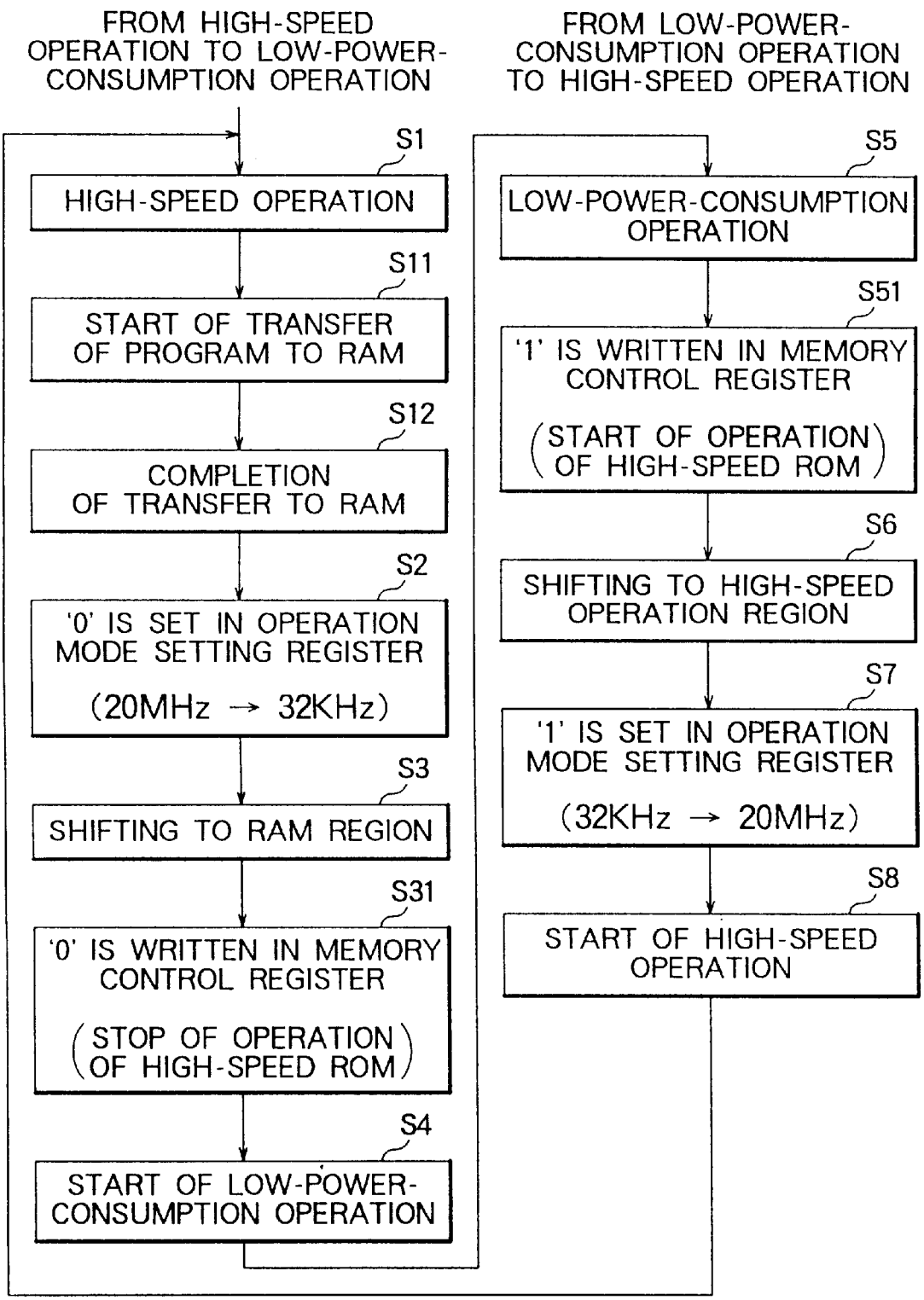
FIG. 9, is a flow chart showing an example of operation of the microcomputer illustrated in FIG. 8.

Referring to 8 together with FIG. 9 showing a flow chart of processing of this embodiment, the operation of this embodiment will be described. If the operation is changed from the high-speed operation (step S1) to the low-power-consumption operation, a program required in the low-power-consumption operation is transferred from the external ROM 6 to the RAM 5 (step S11). In this event, a program required in the low-power-consumption operation may be transferred from the high-speed ROM 11 to the RAM 5. After completion of transfer of the program (step S12), zero is written into the operation mode setting register 22 (step S2) to change the operation frequency from 20 MHz into 32 KHz. Then, shifting to the RAM 5 is carried out (step S3). Zero is written into the memory control register 23 (step S31) to stop the operation of the high-speed ROM 11 and to perform the low-power-consumption operation (steps S4, S5).

Subsequently, when the operation is changed from the low-power-consumption operation to the high-speed operation, one is written into the memory control register 23 (step S51) to restart the operation of the high-speed ROM 11. After start of operation of the high-speed ROM 11, shifting to the high-speed ROM 11 is carried out (step S6). One is written into the memory control register 23 to change the operation frequency from 32 KHz into 20 MHz (step S7). Then, the high-speed operation is started (step S8).

Figure 10:
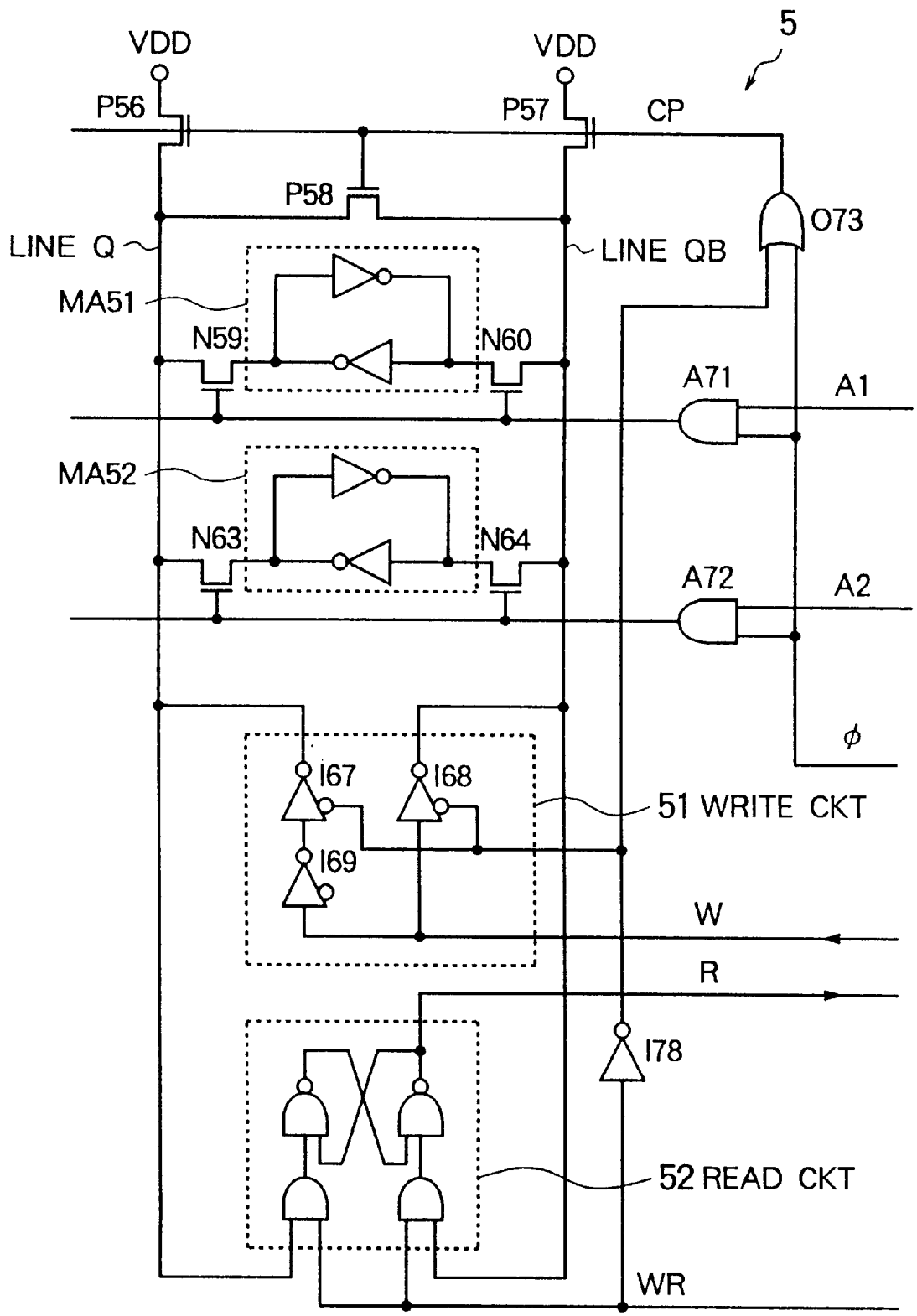
FIG. 10 is a circuit diagram showing an example of an RAM of the microcomputer illustrated in FIG. 8.

Next referring to FIG. 10 showing a circuit diagram of the low-power-consumption RAM 5, the RAM 5 comprises RAM cells MA51 and MA52, a write circuit 51, a read circuit 52, P-channel transistors P56, P57, and P58, N-channel transistors N59, N60, N63, and N64, an inverter I78, an OR circuit O73, and AND circuits A71 and A72.

The operation will be described. In order to transfer the program to the RAM 5, data D of the program are supplied from a write data line W to the write circuit 51. After the supply, the CPU 2 sets a R/W signal line WR at the L level. Through the inverter I78, clocked inverters I67 and I68 in the write circuit 51 start to operate so that the input data D and inverted data DB thereof are transmitted to a line Q and a line QB, respectively. Thus, the data are memorized in a selected one of the RAM cells MA51 and MA52 selected by the address lines A1 and A2.

In order to read the memorized data from the RAM 5, the R/W signal line WR is set at the H level. In this event, the OR circuit 73 produces a clock CP through the inverter I78. When the clock CP has the L level, the lines Q and QB are precharged through the transistors P56, P57, and P58. When the clock CP has the H level, precharging comes to an end. The selected one of the RAM cells MA51 and MA52 is selected by the address lines A1 and A2. The held values of the RAM cells MA51 and MA52 and the inverted values thereof are supplied to the lines Q and QB, respectively. The lines Q and QB are connected to the read circuit 52 where the values of the RAM cells MA51 and MA52 are latched and outputted through a read data line R. The read circuit 52 is of a dynamic readout type and is therefore smaller in current consumption than the current-sensing amplifier used in the high-speed readout operation.

As described in the foregoing, the power consumption of the memory is equal to about 61 $\mu$A in the prior art even in the low-speed low-power-consumption operation in case where the memory size is on the order of several hundreds Kbytes.

According to this invention, the program memory is divided so that, during the low-speed operation such as the stand-by period, only the low-speed operation memory ROM storing the corresponding program alone is used to execute the program. In this period, the current supply to the high-speed operation memory ROM high in power consumption is stopped. With this structure, the memory capacity of several tens Kbytes is sufficient during the low-power-consumption operation. Therefore, even if the overall program size is increased, the power consumption of the memory is suppressed to about 15 $\mu$A or less. In other words, even if the overall program size is increased, the low-power-consumption operation is possible.

Summarizing in FIG. 8 and 10, the low-speed operation memory is a low-power-consumption RAM (random access memory) (5) including RAM cells (MA51, MA52) and a low power consumption readout circuit (52) of a bit-line charge/discharge type which is lower in power consumption than the high-speed operation ROM (11). The low power consumption readout circuit is used as a readout circuit in reading the low-speed mode program from the RAM cells.

As described above, in the microcomputer according to this invention, the program memory comprises the high-speed operation memory storing the high-speed mode program, the low-speed operation memory storing the low-speed mode program and read by the second range of the program address, and the memory operation control means for producing the high-speed operation stop signal upon the low-speed operation. Therefore, during the low-speed operation such as the standby period, the low-speed operation memory ROM alone is used to execute the program. During this period, the current supply to the high-speed operation memory ROM high in power consumption is stopped. Thus, even if the overall program size is increased, the low-power-consumption operation is possible.

What is claimed is:

1. A microcomputer comprising a program memory for memorizing a program, a central processing unit (2 or 2A) operable in one of high-speed and low-speed modes in which said central processing unit carries out high-speed and low-speed operations when supplied with high-speed and low-speed clock signals (CKH and CKL), respectively, and an operation clock supplying circuit (4) for supplying said central processing unit with one of said high-speed and said low-speed clock signals that corresponds to said one of the high-speed and the low-speed modes when said central processing unit operates in said one of the high-speed and the low-speed modes, said central processing unit comprising a program counter (21) for producing a program address for use in reading said program from said program memory and an operation mode setting register (22) for setting a different one of said high-speed and said low-speed modes to produce an operation mode signal (M) representing said different one of the high-speed and the low-speed modes, said operation clock supplying circuit being connected to said operation mode setting register to supply said central processing unit with a different one of said high-speed and said low-speed clock signals when said operation mode signal represents said different one of the high-speed and the low-speed modes, wherein:

said program memory comprises a high-speed operation memory (11) for memorizing a high-speed mode program which is read by a first predetermined address range of said program address and which is delivered to said central processing unit to make said central processing unit carry out said high-speed operation and a low-speed operation memory (12) for memorizing a low-speed mode program which is read by a second predetermined address range of said program address and which is delivered to said central processing unit to make said central processing unit carry out said low-speed operation;

said microcomputer further comprising memory operation control means (3 or 23) for producing a high-speed operation stop signal for stopping operation of said high-speed operation memory when said central processing unit carries out said low-speed operation.

2. A microcomputer as claimed in claim 1, wherein:

said memory operation control means is a memory controller (3) which is connected to said program counter for producing said high-speed operation stop signal when said memory controller detects said second predetermined address range of said program address.

3. A microcomputer as claimed in claim 1, wherein:

said memory operation control means further produces a low-speed operation stop signal for stopping operation of said low-speed operation memory when said central processing unit carries out said high-speed operation.

4. A microcomputer as claimed in claim 3, wherein:

said memory operation control means is a memory controller (3) which is connected to said program counter for producing, when said memory controller detects said second predetermined address range of said program address, said high-speed operation stop signal and for producing, when said memory controller detects said first predetermined address range of said program address, said low-speed operation stop signal.

5. A microcomputer as claimed in claim 1, wherein:

said memory operation control means is a memory control unit (23) included in said central processing unit (2A) for producing said high-speed operation stop signal when said central processing unit carries out said low-speed operation.

6. A microcomputer as claimed in claim 5, wherein:

said memory control unit further produces a low-speed operation stop signal for stopping operation of said low-speed operation memory when said central processing unit carries out said high-speed operation.

7. A microcomputer as claimed in claim 1, wherein:

said high-speed operation memory comprises a high-speed operation ROM (read-only memory) (11) comprising ROM cells (M3, M5) for memorizing said high-speed mode program and a current-sensing amplifier readout circuit (101) used as a readout circuit in reading said high-speed mode program from said ROM cells;

said low-speed operation memory comprising a low power consumption ROM (12) comprising different ROM cells (M3, M5) for memorizing said low-speed mode program and a low power consumption readout circuit (102) of a bit-line charge/discharge type which is lower in power consumption than said high-speed operation ROM, said low power consumption readout circuit being used as another readout circuit in reading said low-speed mode program from said different ROM cells.

8. A microcomputer as claimed in claim 1, wherein:

said high-speed operation memory comprises a high-speed operation ROM (read-only memory) (11) comprising ROM cells (M3, M5) for memorizing said high-speed mode program and a current-sensing amplifier readout circuit (101) used as a readout circuit in reading said high-speed mode program from said ROM cells;

said low-speed operation memory comprises a low-power-consumption RAM (random access memory) (5) comprising RAM cells (MA51, MA52) and a low power consumption readout circuit (52) of a bit-line charge/discharge type which is lower in power consumption than said high-speed operation ROM, said low power consumption readout circuit being used as another readout circuit in reading said low-speed mode program from said RAM cells.

\* \* \* \* \*